(12) United States Patent
Tanisaka et al.

(10) Patent No.: US 9,236,710 B2
(45) Date of Patent: Jan. 12, 2016

(54) SEMICONDUCTOR LASER ELEMENT AND METHOD OF MANUFACTURING THE SAME

(71) Applicant: NICHIA CORPORATION, Anan-shi, Tokushima (JP)

(72) Inventors: Shingo Tanisaka, Komatsushima (JP); Hiroki Koizumi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 13/688,326

(22) Filed: Nov. 29, 2012

(65) Prior Publication Data

US 2013/0142209 A1    Jun. 6, 2013

(30) Foreign Application Priority Data

Dec. 2, 2011  (JP) ................. 2011-264344

(51) Int. Cl.
*H01L 33/00* (2010.01)
*H01S 5/10* (2006.01)
*H01S 5/02* (2006.01)
*H01S 5/22* (2006.01)
*H01S 5/323* (2006.01)

(52) U.S. Cl.
CPC ............... *H01S 5/10* (2013.01); *H01L 33/005* (2013.01); *H01S 5/0202* (2013.01); *H01S 5/0207* (2013.01); *H01S 5/22* (2013.01); *H01S 5/32341* (2013.01); *H01S 2301/18* (2013.01)

(58) Field of Classification Search
CPC ......... H01L 21/20; H01L 33/00; H01L 21/02; H01L 21/30
USPC ........................ 438/33, 47–49, 5, 31, 462, 22; 372/43.01; 257/E21.366, 237, 238, 257/E21.131, E21.599, E21.21, E21.088, 257/E21.214
See application file for complete search history.

(56) References Cited

U.S. PATENT DOCUMENTS

| 5,316,967 | A | * | 5/1994 | Kaneno et al. ................... 438/33 |
| 5,585,957 | A | * | 12/1996 | Nakao et al. .................. 359/248 |
| 5,780,320 | A | * | 7/1998 | Kinoshita ........................ 438/33 |
| 5,793,914 | A | * | 8/1998 | Sasaki .............................. 385/49 |
| 5,835,659 | A | * | 11/1998 | Ota et al. ....................... 385/137 |
| 7,724,793 | B2 | * | 5/2010 | Kawakami et al. ........ 372/43.01 |

(Continued)

FOREIGN PATENT DOCUMENTS

| JP | 2003-023215 A | 1/2003 |
| JP | 2009-105466 A | 5/2009 |

(Continued)

*Primary Examiner* — Amar Movva
*Assistant Examiner* — Sheikh Maruf
(74) *Attorney, Agent, or Firm* — Global IP Counselors, LLP

(57) ABSTRACT

A method of manufacturing a semiconductor laser element including: preparing a wafer; forming first grooves on at least one of an upper surface and a lower surface of the wafer, each of the first grooves being spaced apart from the optical waveguide formed in the wafer and extending in a direction intersecting the optical waveguide in a plan view; forming second grooves on the one of the upper surface and the lower surface of the wafer, each of the second grooves extending in a direction intersecting a straight line extended from each of the first grooves, and each of the second grooves having a smooth surface compared with the first grooves; dividing the wafer along the first grooves to obtain a plurality of laser bars; and dividing the laser bars in a direction intersecting an extending direction of the first grooves to obtain the semiconductor laser elements.

17 Claims, 5 Drawing Sheets

(56) References Cited

U.S. PATENT DOCUMENTS

| | | | |
|---|---|---|---|
| 7,772,020 B2* | 8/2010 | Yoo | 438/29 |
| 8,062,959 B2* | 11/2011 | Sakamoto et al. | 438/460 |
| 8,139,619 B2* | 3/2012 | Takagi et al. | 372/44.011 |
| 8,546,163 B2* | 10/2013 | Yoshizumi et al. | 438/33 |
| 8,563,343 B2* | 10/2013 | Motoda | 438/33 |
| 2007/0121692 A1* | 5/2007 | Kawakami et al. | 372/43.01 |
| 2008/0056319 A1* | 3/2008 | Ohno | 372/43.01 |
| 2009/0137098 A1* | 5/2009 | Sakamoto et al. | 438/462 |
| 2009/0180505 A1* | 7/2009 | Kohda et al. | 372/43.01 |
| 2009/0262771 A1* | 10/2009 | Inoue et al. | 372/45.01 |
| 2011/0104839 A1* | 5/2011 | Hiroyama et al. | 438/31 |
| 2011/0183453 A1* | 7/2011 | Hironaka et al. | 438/33 |
| 2011/0292959 A1* | 12/2011 | Shimamoto et al. | 372/46.012 |
| 2012/0094415 A1* | 4/2012 | Yagi et al. | 438/33 |
| 2012/0107968 A1* | 5/2012 | Yoshizumi et al. | 438/5 |

FOREIGN PATENT DOCUMENTS

| | | | |
|---|---|---|---|
| JP | 2009117494 A | * | 5/2009 |
| JP | 2011-077419 A | | 4/2011 |

* cited by examiner (Prior Art)

SEMICONDUCTOR LASER ELEMENT AND METHOD OF MANUFACTURING THE SAME

CROSS-REFERENCE TO RELATED APPLICATIONS

This application claims priority to Japanese Application No. 2011-264344 filed on Dec. 2, 2011. The entire disclosure of Japanese Application No. 2011-264344 is incorporated herein by reference.

BACKGROUND OF THE INVENTION

1. Field of the Invention

The present invention relates to a semiconductor laser element and a method of manufacturing the same, and particularly to a method of dividing a wafer having a semiconductor structure on a substrate into individual semiconductor laser elements.

2. Discussion of the Related Art

Generally, in a semiconductor laser element, the resonator surface for laser oscillation is formed by using cleaved surfaces of a crystal. Because an AlGaInN-based group-III nitride semiconductor has a hexagonal crystal structure, in a step of forming resonator surfaces (hereinafter may be referred to as "step of obtaining laser bars") by dividing a semiconductor wafer (hereinafter may be referred to as "wafer") by cleavage, the dividing direction may deviate from its intended direction. In order to prevent the deviation in the dividing direction, for example, a technology for forming cleavage guide grooves 113 in shape of broken lines along the dividing direction which is perpendicular to the optical waveguides 112 in a LD structure 111 stacked on a GaN substrate 110, as shown in FIG. 6, is disclosed (for example, see Japanese Laid-Open Patent Application Publication No. 2009-105466 A).

However, as in the above mentioned publication, forming of the cleavage guide grooves by using RIE (Reactive Ion Etching) takes time which results in decreasing of productivity. For this reason, a technique is proposed in which on a lower surface of a wafer on which the semiconductor layer 1 is stacked and a ridge 4 is formed on the semiconductor layer, as shown in a cross sectional view of FIG. 7(a), a cleavage guide groove 5 is formed and dividing is carried out. Examples of techniques for forming the cleavage guide groove 5 in a short time include a processing technique using a laser beam. However, a processing technique using laser irradiation has a problem that since the formation is conducted using a high energy for a short time, microscopic irregularities occur on the surfaces of the cleavage guide grooves 5. Cleaving a wafer 1 along such cleavage guide grooves 5 results in generation of line-shaped step differences 3 (in the present specification, the term "line-shaped step differences" may be referred to simply as "lines" or "step differences") due to deviation in height of the cleaved surface with respect to the direction perpendicular to the cleaved surface 2, which is caused by the microscopic irregularities on the surfaces of the cleavage guide grooves 5. That is, the step difference 3 occurs as shown in FIG. 7(b) when viewed from the upper surface of the wafer (a direction shown by an arrow A in FIG. 7(a)), and as shown in FIG. 7(c) when viewed from a side surface of the wafer (a direction shown by an arrow B in FIG. 7(a)). If the step differences in the cleaved surface reach the optical waveguide, light oscillating in the optical waveguide at the time of operating the laser hits the step difference and is scattered, which results in decrease in the optical output power and emission in unintended directions, which adversely affect the FFP (Far Field Pattern).

SUMMARY OF THE INVENTION

The present invention is devised to solve the problems described above and an object of the present invention is to provide a semiconductor laser element excellent in optical output power and FFP, and a method of manufacturing the same.

A method of manufacturing a semiconductor laser element according to one aspect of the present invention includes: preparing a wafer containing a plurality of semiconductor laser elements each having, in order from a lower surface side of the wafer, a substrate and a semiconductor structure having an optical waveguide; forming a plurality of first grooves on at least one of an upper surface and a lower surface of the wafer, each of the first grooves being spaced apart from the optical waveguide and extending in a direction intersecting the optical waveguide in a plan view; forming a plurality of second grooves on the one of the upper surface and the lower surface of the wafer having the first grooves formed thereon, each of the second grooves extending in a direction intersecting a straight line extended from each of the first grooves, and each of the second grooves having a smooth surface compared with the first grooves; dividing the wafer along the first grooves to obtain a plurality of laser bars; and dividing the laser bars in a direction intersecting an extending direction of the first grooves to obtain a plurality of the semiconductor laser elements.

A semiconductor laser element according to an embodiment includes, in order from its lower surface side, a substrate and a semiconductor structure, and the semiconductor structure has resonator end surfaces formed by cleavage and an optical waveguide in a direction intersecting the resonator end surfaces. Further, at each resonator end surface, a first groove and second grooves are formed in the lower surface side of the substrate. The first groove is spaced apart from the optical waveguide and extends along the resonator end surface. Each of the second grooves extends to intersect a straight line extended from the first groove and has a smoother surface than that of the first groove.

According to the present invention, a semiconductor laser element excellent in optical output power and FFP can be obtained.

DETAILED DESCRIPTION OF EMBODIMENTS

Figure 1A:
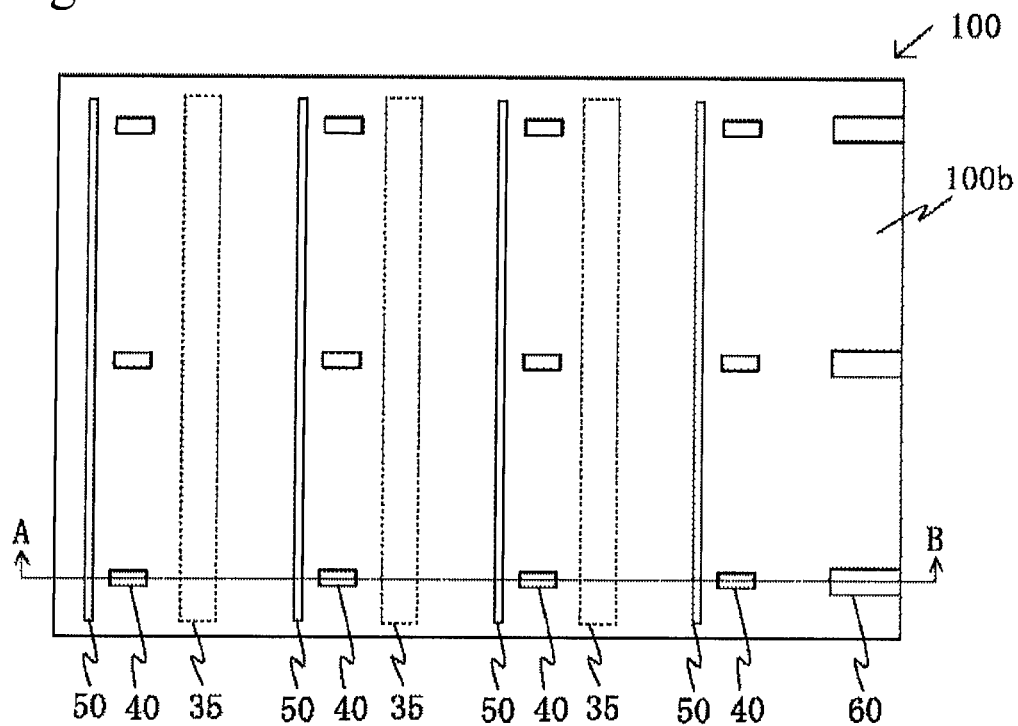
FIG. 1A is a plan view of a wafer according to an embodiment of the present invention, seen from the lower surface side.

The following description will describe an embodiment of the present invention with reference to the drawings. The embodiments described below are intended to exemplify the technical spirit of the present invention, and the scope of the invention is not limited to those described below. The sizes and the positional relationships of the members in each of drawings are occasionally shown exaggerated for ease of explanation. Further, in the description below, the same designations or the same reference numerals denote the same or like members and duplicative descriptions will be appropriately omitted.

Figure 2:
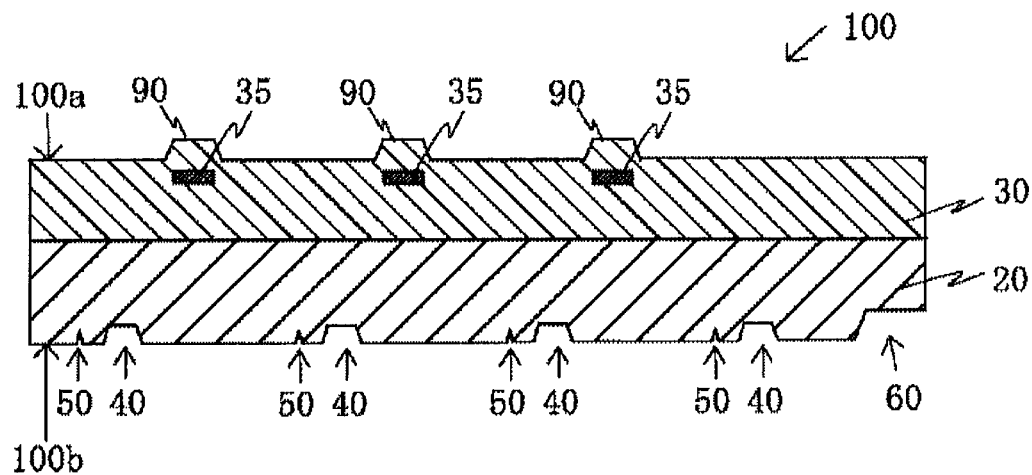
FIG. 2 is a cross-sectional view of the wafer shown in FIG. 1A taken along line A-B.
Figure 3:
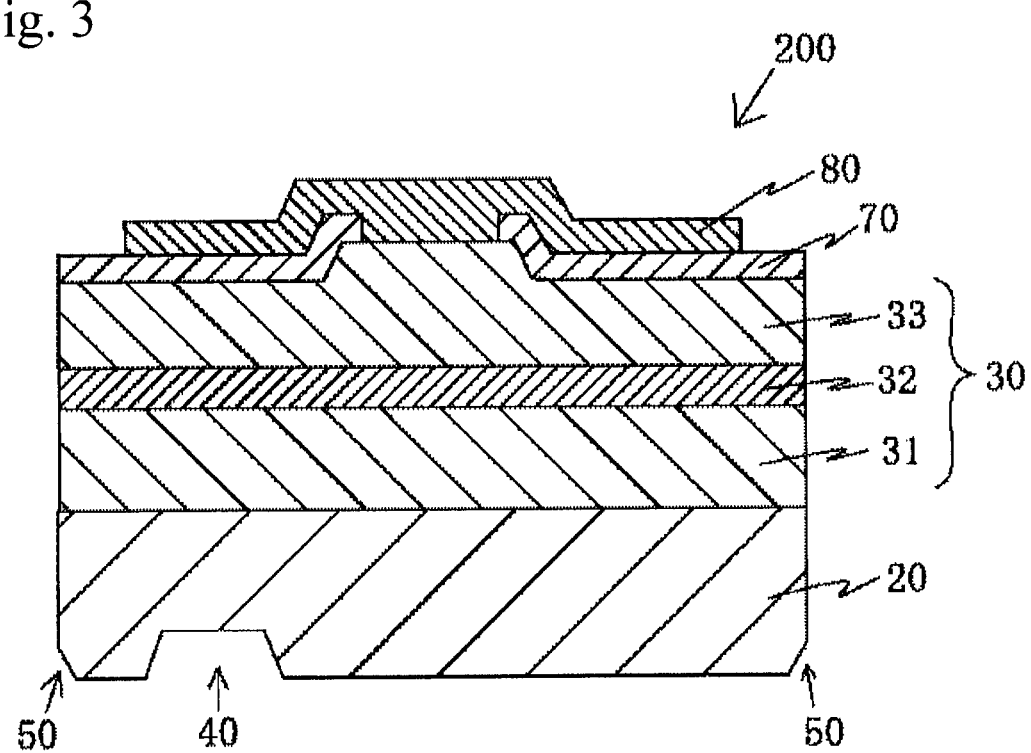
FIG. 3 is a cross-sectional view of a semiconductor laser element according to an embodiment of the present invention.
Figure 4:
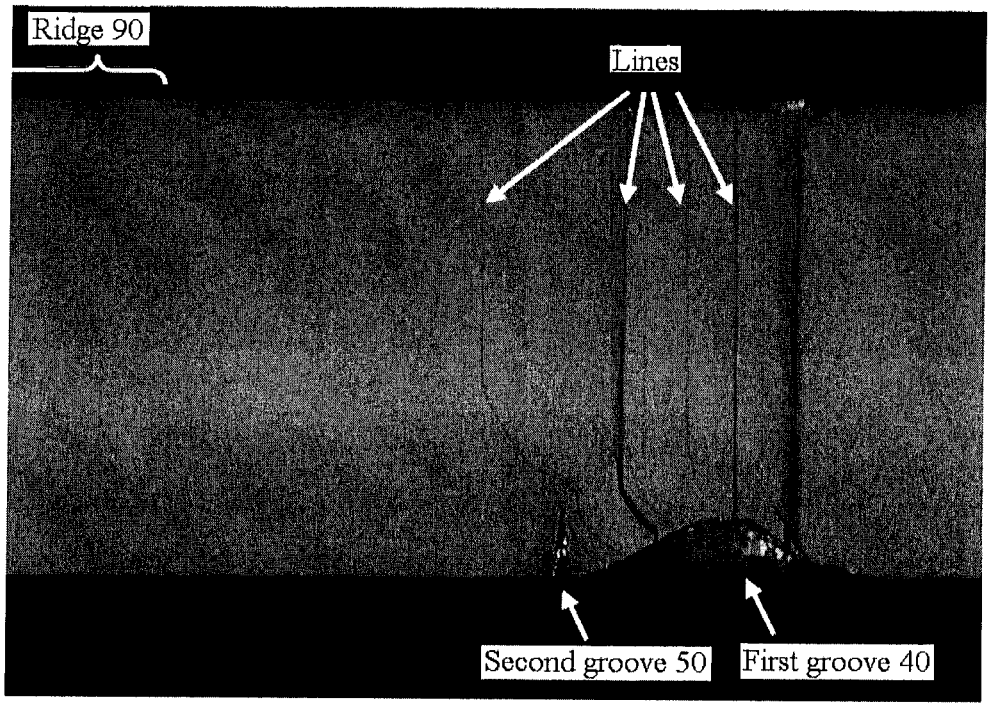
FIG. 4 is an image showing a cleaved surface of a laser bar in which a second groove is formed.
Figure 5:
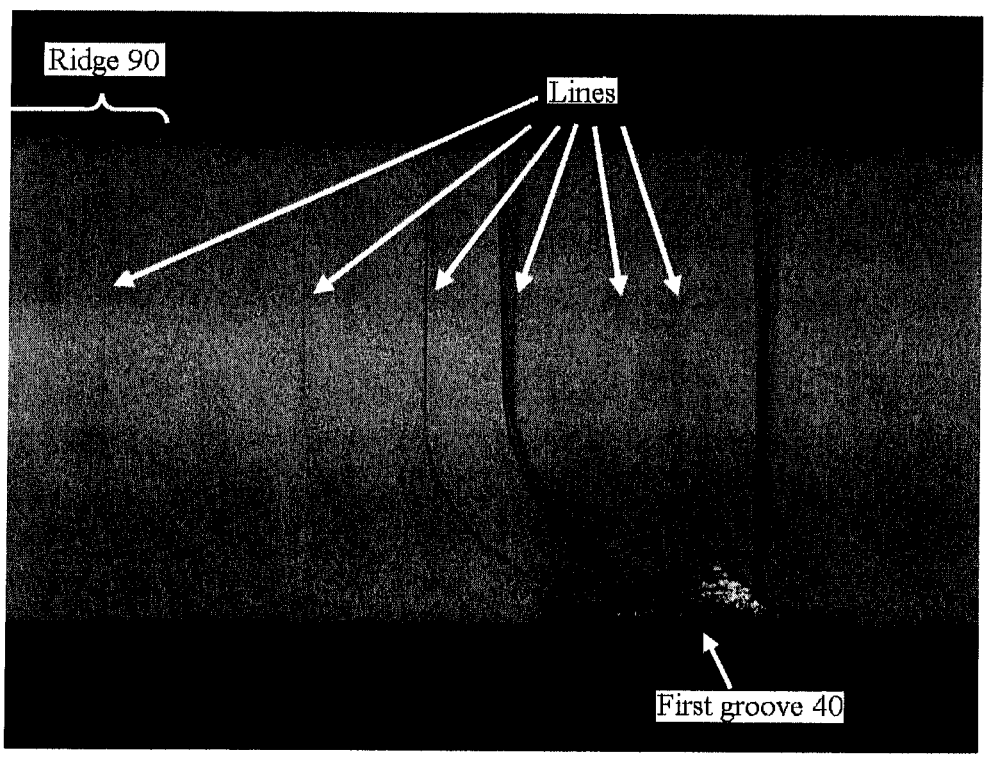
FIG. 5 is a cross-sectional image of a laser bar in which a second groove is not formed.
Figure 6:
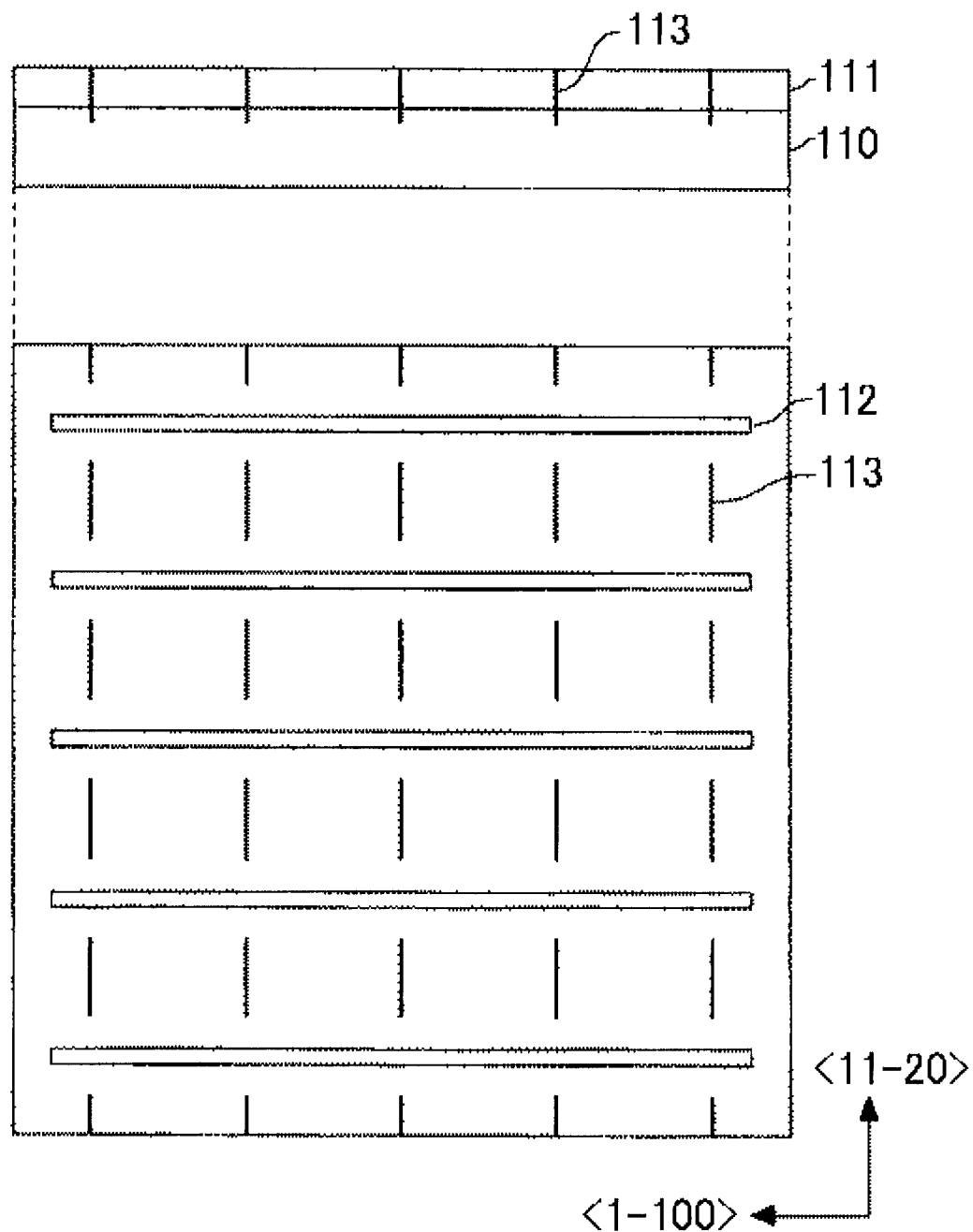
FIG. 6 is a plan view showing a structure of a conventional wafer.
Figure 7:
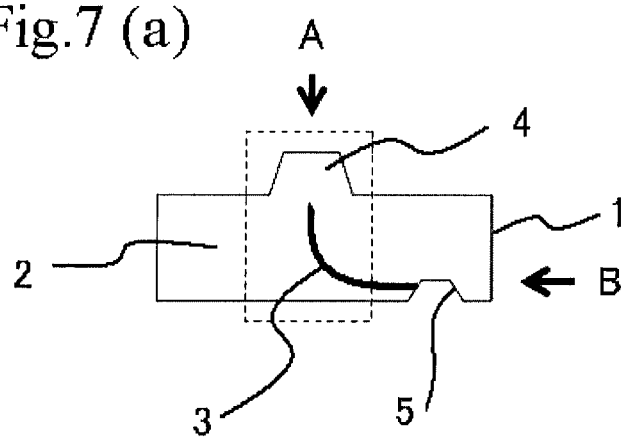
FIG. 7(a) is a cross-sectional view showing a structure of another conventional wafer.
FIG. 7(b) is a plan view seen from a direction indicated by an arrow A in FIG. 7(a)
FIG. 7(c) is a side view seen from a direction indicated by an arrow B in FIG. 7(a).
Figure 7:
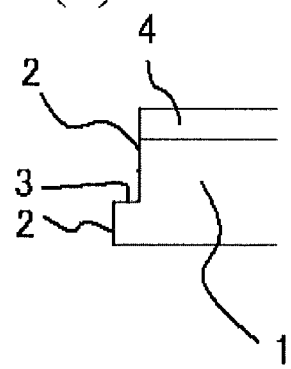
Figure 7:
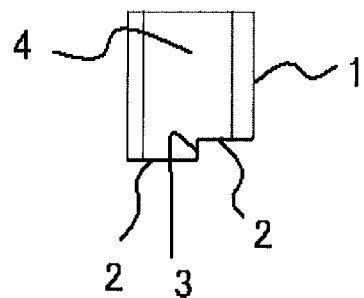

FIG. 1A is a plan view of a wafer 100 used in the present embodiment, seen from the lower surface side. FIG. 2 is a cross-sectional view taken along line A-B of FIG. 1A, and FIG. 3 is a cross-sectional view of a semiconductor laser element 200 obtained in the present embodiment. Also, for illustrating an effect of the present invention, FIG. 4 shows a cross-sectional image of a laser bar in which second grooves are formed, and FIG. 5 shows a cross-sectional image of a laser bar in which a second groove is not formed. In FIG. 1A and FIG. 2, the p-electrode, the n-electrode, and the dielectric film are omitted, and in FIG. 3, the n-electrode is omitted.

A method of manufacturing a semiconductor laser element 200 includes steps of preparing a wafer 100 containing a plurality of semiconductor laser elements having, in order from a lower surface side 100b thereof, a substrate 20 and a semiconductor structure 30 having an optical waveguide 35, forming first grooves on at least one of the upper surface side 100a and the lower surface side 100b of the wafer 100, first grooves 40 each being spaced apart from the optical waveguide 35 and extending in a direction intersecting the optical waveguide 35, forming second grooves 50 on at least one of the upper surface side 100a and the lower surface side 100b of the wafer 100 having the first grooves 40 formed thereon, second grooves 50 each extending in a direction intersecting a straight line extended from each of the first grooves 40, and having smoother surfaces compared with the first grooves 40, obtaining laser bars by dividing the wafer 100 along the first grooves 40; and obtaining individual semiconductor laser elements 200 by dividing the laser bars in a direction intersecting the extending direction of the first grooves 40.

According to the method of manufacturing a semiconductor laser element of the present invention, in the step of obtaining laser bars, the line-shaped step differences extending from the first grooves 40 toward the respective optical waveguides 35 can be stopped at the second grooves 50, and thus at the time of laser operation, reduction of the optical output power and deterioration of FFP characteristics can be prevented.

That is, as shown in FIG. 5, the step differences generated at the time of cleavage advance from the first grooves 40 in a horizontal direction (a direction of the plane of the wafer 100 which is also a direction toward (to intersect with) the optical waveguide 35, leftward in FIG. 5), then, advance toward the upper surface side 100a (a direction perpendicular to the direction of the plane of the wafer, upward direction in FIG. 5) of the wafer. In the case where the second grooves are not provided (see FIG. 5), among the lines occurred from the first grooves 40, the presence of a line which reaches the optical waveguide 35 located immediately below the ridge 90 may be observed. As in such a case, formation of a line in the optical waveguide 35 may lead to a reduction in optical output power and deterioration in the FFP properties, which may result in a semiconductor laser element incapable of providing sufficient performance.

In contrast, as shown in FIG. 4, in the case where the second grooves are formed, the lines advancing in a horizontal direction toward (to intersect with) the optical waveguide 35 among a plurality of lines occurred from the first grooves 40 are blocked and prevented them from reaching the optical waveguide 35. Further, forming the second grooves with smoother surfaces than that of the first grooves, occurrence of new lines from the second grooves can be prevented. Accordingly, the lines are not formed in the optical waveguide 35 and a semiconductor laser element having excellent optical output power and FFP properties can be obtained.

Figure 1B:
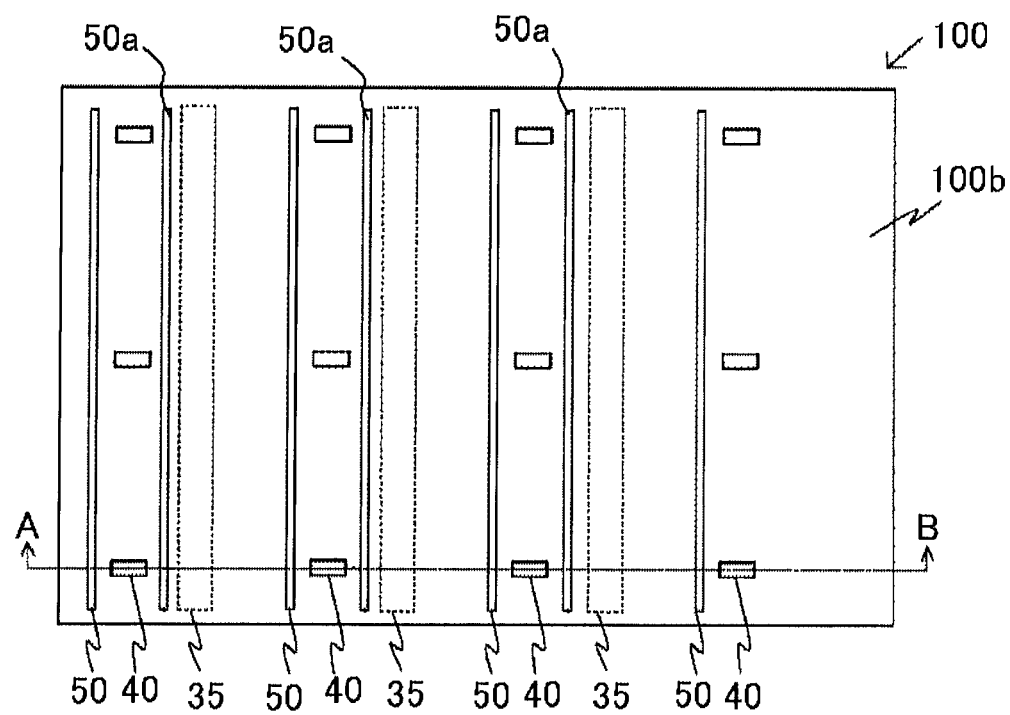
FIG. 1B is a plan view of a wafer according to another embodiment of the present invention, seen from the lower surface side.

In addition, for easy cleaving, grooves 60 (see FIG. 1A and FIG. 2) which are deeper than the first grooves 40 and extending in the same direction as the first grooves 40 may be formed. In this case, each groove 60 is preferably formed at a position having a greater distance from the optical waveguide 35 than the distance between the optical waveguide 35 and the corresponding first grooves 40. The blade is placed at the upper surface side 100a of the wafer, at an opposite position to the first grooves 40 and the groove 60, and pressure is applied from the groove 60 side (that is, from the right side in FIG. 4 and FIG. 5) to cleave the wafer from the groove 60 along the first grooves 40. Accordingly, the lines occurred at the time of cleavage advance in one direction of advancing cleavage (that is, in a left side direction of the first grooves 40 in FIG. 4 and FIG. 5). In this case, the second groves 50 are formed at least in one side of the corresponding first grooves 40. Also, regardless of the formation of the grooves 60, from the upper surface of the wafer, the entire cleavage lines may be pressed at the same time to individually divide. In this case, the lines generated at the time of cleaving advance in directions along both sides of the first grooves 40 where cleavage is in progress. Therefore, as shown in FIG. 1B, the fourth grooves 50a may be additionally formed along the corresponding second grooves 50 so that the second grooves 50 and the fourth grooves 50a are arranged at the respective both sides of the first grooves 40.

Hereinafter, each step of manufacturing semiconductor laser elements will be described.

Step of Preparing Wafer

First, on a substrate 20 made of GaN, a semiconductor structure 30 of an n-type semiconductor layer 31, an active layer 32, and a p-type semiconductor layer 33 were formed in this order. In this embodiment, $In_xAl_yGa_{1-x-y}N$ ($0 \leq x \leq 1$, $0 \leq y \leq 1$, $0 \leq x+y \leq 1$) was used for each layer. It is sufficient that the substrate 20 is able to be cleaved and is not limited to a GaN substrate, and the examples thereof include a substrate having a crystal plane such as an insulating substrate such as sapphire or spinel ($MgAl_2O_4$), silicon carbide, silicon, ZnS, ZnO, GaAs, diamond, and an oxide substrate such as lithium niobate and neodymium gallete which are capable of forming a lattice junction with the nitride semiconductor, and a nitride semiconductor substrate (GaN, AlN etc).

Then, etching was carried out on portions of the semiconductor structure 30 and stripe-shaped ridges 90 were formed. Thereafter, a p-electrode 80 is formed on the upper surface of each ridge 90. In this embodiment, Ni/Au/Pt was used as the p-electrodes 80. An optical waveguide 35 is formed in the semiconductor structure 30 with respect to each of the stripe-shaped ridges 90.

Next, the lower surface side of the substrate 20 is preferably thinned by polishing or CMP to adjust the thickness of the wafer 100, for example to about 50 to 200 μm, more specifically to about 100 μm. Thus facilitates dividing of the wafer 100 in the step of dividing laser bars which will be described later.

Next, n-electrodes are formed on the lower surface side of the substrate 20. In the present embodiment, the n-electrodes were formed in order of Ti/Au/Pt/Au. An alternative to form the n-electrodes on the lower surface side of the substrate 20, portions of the n-type semiconductor layer 31 are exposed by performing a dry-etching from the upper surface side 100a of the wafer and the n-electrodes are formed on the exposed portions. As described above, the wafer 100 having a plurality of semiconductor laser elements arranged thereon is prepared.

Step of Forming First Grooves

The first grooves 40 serve as cleavage guide grooves at the time of dividing the wafer 100 to obtain cleavage surfaces. In the present embodiment, the first grooves 40 are formed on the lower surface side 100b of the wafer. Moreover, in a plan view, the first grooves 40 are formed spaced apart from the optical waveguide 35 and extending in a direction intersecting the optical waveguide 35. That is, the first grooves preferably extend to form broken lines in a plan view so as not to intersect the optical waveguide 35. The first grooves 40 are preferably formed to have distances between an end of respective ones of the first grooves 40 and their corresponding optical waveguides 35 are different from the distances between the other end of respective ones of the first grooves 40 and their corresponding optical waveguides 35. The first grooves 40 can be formed through laser ablation processing.

The cross-sectional shape of the first grooves 40 in the extended direction of the first grooves 40 is a trapezoidal shape as shown in FIG. 4, but for example, any one of a quadrangle shape, a partially circular shape, a partially oval shape, an inverse trapezoidal shape, a parallelogram shape, and a V-shape may be employed.

The depth of the first grooves 40 is preferably 5 μm or more and 20 μm or less. The length of the first grooves 40 in their extended direction is preferably 30 μm or more and 60 μm or less, which is longer than the width of the first grooves 40 in a direction perpendicular to the extended direction of the first grooves 40. With this arrangement, cleavage efficiency can be further increased. Further, in order to interrupt the above-described lines from reaching the optical waveguides 35, the first grooves 40 are preferably arranged as far as possible from the optical waveguides 35. More specifically, a distance between an end of respective ones of the first grooves 40 and their corresponding optical waveguides 35 (for example, a distance from an end of respective ones of the first grooves 40 to optical waveguides 35 respectively located in the advancing directions of the lines) is preferably 60 μm or greater. In the present embodiment, the depth of the first grooves 40 was 10 μm. the length of the first grooves 40 in their extended direction was 50 μm, and the width of the first grooves 40 in a direction perpendicular to their extended direction was 7 μm.

Step of Forming Second Grooves

The second grooves 50 serve as line blocking grooves to block the lines occurred from the first grooves 40 at the time of dividing the wafer. The second grooves 50 are formed, on the lower surface side 100b of the wafer where the first grooves 40 are formed. The second grooves extend to intersect the straight lines each of which is an extension from the first grooves 40 (that is, a second groove 50 does not intersect the first grooves 40 but intersects a straight line (not shown) extending in the extended direction of the first grooves 40), and the second grooves have surfaces smoother than that of the first grooves 40. The second grooves 50 can be formed through dry etching processing, wet etching processing, laser ablation processing, or the like. Particularly, the second grooves 50 are preferably formed by using a laser which has high focusing capability. In the case where the cross-section of the first grooves 40 has a trapezoidal shape, a quadrangular shape, a partially circular shape, a partially oval shape, an inverse trapezoidal shape, a rectangular shape, or the like, the cross-section of the second grooves 50 preferably has a V-shape in a cross-sectional shape viewed from the cleaved surface (or viewed in a direction in parallel with the cleaved surface). In the case where the cross section of the first grooves 40 has a V-shape, the cross-section of the second grooves 50 preferably has a V-shape with a sharper acute angle than that of the first grooves 40. Also, in a direction perpendicular to the extended directions of the grooves, the cross-sections of both the first grooves 40 and the second grooves 50 have a V-shape or a shape similar to a V-shape. In the specification, the term "a smooth surface" means a surface which does not have irregularities, but in a narrow sense, it means the surface has surface irregularities smaller than the surface irregularities that form the first grooves 40. The second grooves 50 are formed on the same surface side of the wafer 100 with respect to the first grooves 40 and spaced apart from the first grooves 40. Thus, the line-shaped step differences advancing in a horizontal direction from the first grooves 40 can be blocked. Further, the second grooves 50 are formed with smooth surfaces, so that occurrence of line-shaped step differences from the second grooves 50 at the time of dividing can also be prevented. Where the second grooves 50 have smoother surfaces than the first grooves 40 can be confirmed, for example, by a cross-sectional SEM image of the first groove 40 in its extended direction.

The first grooves 40 and the second grooves 50 are preferably formed on the lower surface side 100b of the wafer spaced apart from the optical waveguide 35, but not on the upper surface side 100a of the wafer located near the optical waveguide 35. With this arrangement, adverse effects on the optical output or FFP can be minimized. That is, in the case where the first grooves 40 are on the lower surface side 100b of the wafer, the lines originated from the first grooves 40 advance in a horizontal direction toward the optical waveguide 35, then, advance to the semiconductor structure 30 side (upper surface side 100a of wafer) where the optical waveguide 35 is formed. Therefore, in the case where the second grooves 50 are formed in the lower surface side 100b of the wafer as in the case of the first grooves 40, advance of the lines a horizontal direction toward the optical waveguide 35 may not be entirely blocked, the courses of advance of most of the lines which are not blocked can be changed toward the upper surface side 100a of the wafer, so that the lines advance in a longitudinal direction (an upward direction in FIG. 4, in other words, a thickness direction of the wafer) instead of toward the optical waveguide 35. In contrast, in the case where the first grooves 40 and the second grooves 50 are formed on the upper surface side 100a of the wafer, the lines advance from the first grooves 40 in a lateral direction toward the optical waveguide 35 (lateral direction (horizontal direction of wafer) in FIG. 4) and pass across the optical waveguide 35. Thus, if advance of all the lines cannot be blocked at the second grooves 50, the lines will advance in the optical waveguide 35 in a lateral direction. At this point, generally, the optical waveguide 35 is longer in the lateral direction (i.e. a level direction toward optical waveguide 35) than in the longitudinal direction, so that preventing the lines from advancing in the optical waveguide 35 in a lateral direction (that is, the lines are prevented from passing across a long portion of the optical waveguide 35), effects of the lines on the optical output power and FFP can be minimized.

The second grooves 50 are needed to be extended in a direction intersecting the extended direction of the first grooves 40. In other words, it is sufficient that the second grooves are extended to an extent capable of blocking the advance of the lines. The extended direction of the second grooves 50 may be, for example, either perpendicular or at angle with respect to the extended direction of the first grooves 40. Specific examples of the angle between the extended direction of the first grooves 40 and the extended direction of the second grooves 50 in a plan view include an angle of grater than 0° (i.e. the first grooves 40 and the second grooves 50 overlap) to 90° (the first grooves 40 and the second grooves 50 bisect each other at right angles) or less. In view of ease in dividing wafers into individual chips (in the case where wafers are divided along the resonator direction) or in forming the second grooves 50, the second grooves 50 are preferably formed intersect at substantially at right angles with respect to the first grooves 40. The second grooves 50 are extended in a continuous straight line as shown in FIG. 1A, but can be formed in broken line forms, for example. Further, in addition to the second grooves 50, as shown in FIG. 1B, fourth grooves 50a may be formed adjacent to the corresponding ones of the first grooves 40. In this case, it is preferable that the fourth grooves 50a are arranged in parallel to the second grooves 50, and that the distance from one end of each first groove 40 to corresponding second groove 50 and the distance from the other end of each first groove 40 to corresponding fourth groove 50a are approximately the same.

In the case where the first grooves 40 are formed on the upper surface side 100a of the wafer, the second grooves 50 are formed on the upper surface side 100a of the wafer in a similar fashion as the first grooves 40. The first grooves 40 and the second grooves 50 can be formed on both the upper surface side 100a and the lower surface side 100b of the wafer.

The second grooves 50 are preferably formed by using etching processing such as dry etching processing such as RIE or wet etching processing. With this, the second grooves 50 having smooth surfaces can be formed relatively easily. The second grooves 50 can be formed by using laser processing. With this, the second grooves 50 can be formed with smooth surfaces by more simplified process. The smoothness of the surfaces can be evaluated by, for example, comparing SEM images etc. of the first grooves 40 and the second grooves 50. In the present embodiment, the first grooves 40 are formed by using laser processing and the second grooves 50 are formed by using dry etching processing. With this, the first grooves 40 can be formed swiftly and the second grooves 50 having smooth surfaces can be formed more easily. The second grooves 50 are needed to have smooth surfaces and, for example, may be formed by using a laser device having better processing accuracy than the laser device used to form the first grooves 40. In the specification, the expression "a laser device having better processing accuracy" means the use of a laser device capable of creating smoother surfaces, in which laser processing capable of creating smoother surfaces can be performed with adjusting a wavelength, energy, focal point, and the like of the laser beams.

Also, in the step of dividing laser bars to be described later, the laser bars are preferably divided along the second grooves 50. Thus, formation of new grooves is not needed at the time of dividing the laser bars, and the number of the steps of manufacturing can be reduced. At this time, the cross-sectional shape of the second grooves 50 in the extended direction of the first grooves 40 preferably has a tip of an acute angle. With this, dividing can be performed with high accuracy. Further, if the shape is a V-shape, in addition to dividing with high accuracy, etching can be performed in a short time. Thus productivity can be improved. In the specification the V-shape as in above refers to a shape decreasing in width from the surface toward inner portion of the wafer. In the case where the second grooves are formed by using dry etching or wet etching, a $SiO_2$ film is disposed on the entire surface of the wafer, then, the $SiO_2$ film is formed in a desired mask pattern by using photolithography and etching, and using it as a mask, etching is carried out by way of RIE (Reactive Ion Etching) with $SiCl_4$ gas added with a small amount of $Cl_2$ gas or an etchant such as alkaline solution such as KOH solution. Thus, the second grooves of a desired shape, for example, a V-shape or a shape similar to a V-shape, can be formed.

In the present embodiment, the depth of the second grooves 50 was 10 μm which is the same as the first grooves 40. From the first grooves 40, the line-shaped step differences first advance in a lateral direction. Therefore, the depth of the second grooves 50 can be substantially the same as that of the first grooves 40 or preferably deeper than the first grooves 40. With this, the lines occurred from the first grooves 40 can be blocked more surely at the second grooves 50. In order to block the lines more surely at the second grooves 50, the distance between a first groove 40 and the corresponding second groove 50 is preferably as small as possible. The first grooves 40 and the second grooves 50 may be in contact with each other, but it is preferable that they are spaced apart from each other. In the present embodiment, the first grooves 40 and the second groove 50 are formed between each of the optical waveguides 35, but the locations of those are not limited.

Step of Obtaining Laser Bars (Dividing Wafer)

Next, the wafer 100 having the first grooves 40 and the second grooves 50 formed thereon is cleaved along the extended direction of the first grooves 40. Thus, laser bars, each having a pair of cleaved surfaces as a pair of resonator surfaces, are obtained. For cleaving, a known technique such as a technique in which a blade is pressed on the upper surface side or the back surface side and pressed to cleave (i.e. blade breaking), roller braking, or press breaking can be employed. On the other hand, in the earlier step, if the distances from an end of the first grooves 40 to the optical waveguide 35 and the distance from the other end of the first grooves 40 to the optical waveguide 35 are different, and the cleaving using the first grooves 40 are carried out in a predetermined direction, the line-shaped step differences described above are likely to occur along advancing direction of cleavage. For this reason, the direction of cleaving is preferably selected so that a distance from an end of respective ones of the first grooves 40 to corresponding optical waveguides 35 is greater in the advancing direction of cleavage compared to a short distance between the other end of respective ones of the first grooves 40 and the optical waveguides 35. In other words, when each of the first grooves 40 is formed so that a distance between one end of the first groove 40 and an adjacent one of the optical waveguide 35 is smaller than a distance between another end of the first groove 40 and an adjacent one of the optical waveguide 35, the wafer is cleaved from a side having a smaller distance between the one end of the first groove 40 and the optical waveguide toward a side having a greater distance between the another end of the first groove 40 and the optical waveguide.

Step of Dividing Laser Bars

Next, the laser bars are divided in a direction intersecting the extended direction of the first grooves 40 to obtain individual semiconductor laser elements 200. For dividing a laser bar, a known technique such as blade breaking, roller breaking, or press breaking can be employed. At the time of dividing, the laser bars are preferably divided along the second grooves 50.

After the step of obtaining laser bars or after the step of dividing laser bars, an acid washing step may be additionally performed. With this, undesired objects originating from the wafer (for example, a gallium-based oxide) can be removed.

Referring to FIG. 3, a semiconductor laser element 200 obtained by dividing the wafer 100 according to the present embodiment will be described below.

The semiconductor laser element 200 includes in an order from its lower surface side, a substrate 20 and a semiconductor structure 30, and the semiconductor structure 30 has resonator end surfaces formed by cleavage and an optical waveguide in a direction intersecting the resonator end surfaces. Further, at the lower surface side of the substrate 20 in the resonator end surfaces, a first groove 40 and second grooves 50 are formed. The first groove 40 is spaced apart from the optical waveguide and extended along the resonator end surface. Each of the second grooves 50 is extended to intersect a straight line extended from the first groove 40 and has a smoother surface than that of the first groove 40 which can be observed in SEM images.

On the upper surface side of the semiconductor structure 30, a eutectic film 70 is disposed to expose the upper surface of the ridge 90. Further, a p-electrode 80 is disposed on the upper surface of the ridge 90. In the present embodiment, the n-electrode is disposed on the lower surface side of the substrate 20, but is not shown in FIG. 3.

Accordingly, the lines that occurred at the first grooves 40 at the time of cleavage can be blocked at the second grooves 50, so that a semiconductor laser element having excellent output power and FFP can be obtained.

The semiconductor laser element 200 can have the first groove 40 and the second grooves 50 on the lower surface side of the substrate 20. Accordingly, the effects on the FFP by the lines can be minimized.

LIST OF REFERENCE NUMERALS

100 . . . wafer; 100a . . . upper surface side of wafer; 100b . . . lower surface side of wafer; 20 . . . substrate; 30 . . . semiconductor structure; 31 . . . n-type semiconductor layer; 32: active layer; 33 . . . p-type semiconductor layer; 35 . . . optical waveguide; 40 . . . first groove; 50 . . . second groove; 50a . . . fourth groove; 60 . . . groove; 70 . . . dielectric film; 80 . . . p-electrode; 90 . . . ridge; and 200 . . . semiconductor laser element.

What is claimed is:

1. A method of manufacturing a semiconductor laser element comprising:
   preparing a wafer containing a plurality of semiconductor laser elements each having, in order from a lower surface side of the wafer, a substrate and a semiconductor structure having an optical waveguide;
   forming a plurality of first grooves on at least one of an upper surface and a lower surface of the wafer, each of the first grooves being spaced apart from the optical waveguide and extending in a first direction intersecting the optical waveguide in a plan view;
   forming a plurality of second grooves on the one of the upper surface and the lower surface of the wafer having the first grooves formed thereon, each of the second grooves extending in a second direction intersecting the first direction, with the first direction and the second direction being neither coincided with each other nor parallel to each other, and each of the second grooves having a smooth surface compared with the first grooves;
   dividing the wafer along the first grooves to obtain a plurality of laser bars by cleaving the wafer so that a cleavage line advances in the order of one of the first grooves, one of the second grooves, and the optical waveguide; and
   dividing the laser bars in a direction intersecting an extending direction of the first grooves to obtain a plurality of the semiconductor laser elements.

2. The method of manufacturing a semiconductor laser element according to claim 1, wherein
   the forming of the first grooves and the second grooves includes forming the first grooves and the second grooves on the lower surface of the wafer.

3. The method of manufacturing a semiconductor laser element according to claim 1, wherein
   the forming of the first grooves includes forming the first grooves by laser processing, and
   the forming of the second grooves includes forming the second grooves by etching.

4. The method of manufacturing a semiconductor laser element according to claim 1, wherein
   the dividing of the wafer includes dividing the wafer by pressing a blade against the other of the upper surface and the lower surface of the wafer opposite to a surface on which the first and second grooves are formed, at a place corresponding to the first grooves.

5. The method of manufacturing a semiconductor laser element according to claim 1, wherein
   the dividing of the wafer further includes
   forming a plurality of grooves in an end part of the wafer, the grooves having a greater depth than the first grooves and extending along the same direction as the first grooves, and
   pressing a blade from the end part where the grooves are formed to divide the wafer from the grooves along the first grooves.

6. The method of manufacturing a semiconductor laser element according to claim 1, wherein
   the forming of the first grooves includes forming each of the first grooves so that a distance between one end of the first groove and an adjacent one of the optical waveguide is smaller than a distance between another end of the first groove and an adjacent one of the optical waveguide, and
   the dividing of the wafer includes dividing the wafer from a side having a smaller distance between the one end of the first groove and the optical waveguide toward a side having a greater distance between the another end of the first groove and the optical waveguide.

7. The method of manufacturing a semiconductor laser element according to claim 1, wherein
   the forming of the second grooves includes forming the second groves to have a depth that is equal to or greater than a depth of the first grooves.

8. The method of manufacturing a semiconductor laser element according to claim 1, wherein
the dividing of the laser bars includes dividing the laser bars along the second grooves.

9. The method of manufacturing a semiconductor laser element according to claim 8, wherein
the forming of the second grooves includes forming each of the second grooves to have a V-shaped cross section.

10. The method of manufacturing a semiconductor laser element according to claim 1, wherein
the forming of the first grooves includes forming the first grooves by using a laser device, and
the forming of the second grooves includes forming the second grooves by using a laser device which has higher processing accuracy than the laser device used for forming the first grooves.

11. A method of manufacturing a semiconductor laser element comprising:
preparing a wafer containing a plurality of semiconductor laser elements each having, in order from a lower surface side of the wafer, a substrate and a semiconductor structure having an optical waveguide, the preparing of the wafer including forming a ridge defining the optical waveguide on a surface of the semiconductor structure in each of the semiconductor laser elements;
forming a plurality of first grooves on at least one of an upper surface and a lower surface of the wafer, each of the first grooves being spaced apart from the optical waveguide and extending in a direction intersecting the optical waveguide in a plan view;
forming a plurality of second grooves on the one of the upper surface and the lower surface of the wafer having the first grooves formed thereon, each of the second grooves extending in a direction intersecting a straight line extended from each of the first grooves, and each of the second grooves having a smooth surface compared with the first grooves;
dividing the wafer along the first grooves to obtain a plurality of laser bars; and
dividing the laser bars in a direction intersecting an extending direction of the first grooves to obtain a plurality of the semiconductor laser elements, and
the forming of the first grooves and the second grooves includes forming the first grooves and the second grooves on the lower surface of the wafer that is disposed opposite from the surface of the semiconductor structure on which the ridge is formed.

12. The method of manufacturing a semiconductor laser element according to claim 1, wherein
the second grooves are formed such that they are spaced apart from the first grooves.

13. The method of manufacturing a semiconductor laser element according to claim 1, wherein
the second grooves are formed in portions of the one of the upper surface and the lower surface of the wafer, which are level with portions of the one of the upper surface and the lower surface of the wafer in which the first grooves are formed.

14. The method of manufacturing a semiconductor laser element according to claim 1, further including
forming a ridge before the first grooves are formed, and
the first grooves are formed such that they are spaced apart from the ridge.

15. The method of manufacturing a semiconductor laser element according to claim 11, wherein
the second grooves are formed such that they are spaced apart from the first grooves.

16. The method of manufacturing a semiconductor laser element according to claim 11, wherein
the second grooves are formed in portions of the one of the upper surface and the lower surface of the wafer, which are level with portions of the one of the upper surface and the lower surface of the wafer in which the first grooves are formed.

17. The method of manufacturing a semiconductor laser element according to claim 11, further including
forming a ridge before the first grooves are formed, and
the first grooves are formed such that they are spaced apart from the ridge.

* * * * *